United States Patent
Ang et al.

[11] Patent Number: 5,942,919
[45] Date of Patent: Aug. 24, 1999

[54] DIFFERENTIAL RECEIVER INCLUDING AN ENABLE CIRCUIT

[75] Inventors: Michael A. Ang, Santa Clara; Alexander D. Taylor; Jonathan E. Starr, both of Cupertino, all of Calif.

[73] Assignee: Sun Microsystems, Inc., Palo Alto, Calif.

[21] Appl. No.: 08/883,187

[22] Filed: Jun. 25, 1997

[51] Int. Cl.[6] .................................................. G01R 19/00
[52] U.S. Cl. ................................. 327/57; 327/56; 327/89
[58] Field of Search .............................. 327/52–57, 77, 327/89

[56] References Cited

U.S. PATENT DOCUMENTS

| | | | |
|---|---|---|---|
| 4,694,205 | 9/1987 | Shu et al. | 327/53 |
| 4,743,784 | 5/1988 | Obara et al. | 327/57 |
| 4,804,871 | 2/1989 | Walters, Jr. | 327/54 |
| 4,831,287 | 5/1989 | Golab | 327/55 |
| 4,845,675 | 7/1989 | Krenik et al. | 365/203 |
| 4,855,628 | 8/1989 | Jun | 327/57 |
| 4,931,675 | 6/1990 | Iwata | 327/55 |
| 4,937,479 | 6/1990 | Hoshi | 327/55 |
| 5,615,161 | 3/1997 | Mu | 365/208 |

FOREIGN PATENT DOCUMENTS 4-178995  6/1992  Japan .................................. 327/52

*Primary Examiner*—Kenneth B. Wells
*Attorney, Agent, or Firm*—Skjerven, Morrill, MacPherson, Franklin & Friel LLP; Stephen A. Terrile

[57] ABSTRACT

A receiver is provided which quickly and efficiently recognizes signals by including with the receiver a resolving circuit which is coupled to a node control circuit which determines the signals to be recognized. The resolving circuit can operate with supply voltage levels as low as one threshold voltage. Also, the signal hold time can be made very small depending on the sizing of certain transistors. Other advantages include reduced power consumption, high speed operation, good rejection of input noise and power supply noise, ability to resolve small (e.g., 1.0 mVolt) voltage differences, and the ability to function with a variety of types of drivers, including HSTL, DTL and PECL.

51 Claims, 3 Drawing Sheets

DIFFERENTIAL RECEIVER INCLUDING AN ENABLE CIRCUIT

CROSS-REFERENCE TO RELATED APPLICATIONS

This application relates to co-pending U.S. patent application Ser. No. 08/881,925, attorney docket number SP-2078 U.S., filed on Jun. 25, 1997, entitled Broadly Distributed Termination For Buses Using Switched Terminator Logic and naming Jonathan E. Starr as inventor, the application being incorporated herein by reference in its entirety.

This application relates to co-pending U.S. patent application Ser. No. 08/881,926, attorney docket number SP-2489 U.S., filed on Jun. 25, 1997, entitled Method for Resolving Differential Signals and naming Michael A. Ang, Alexander D. Taylor and Jonathan E. Starr as inventors, the application being incorporated herein by reference in its entirety.

This application relates to co-pending U.S. patent application Ser. No. 08/881,939, attorney docket number SP-2086 U.S., filed on Jun. 25, 1997, entitled Impedance Control Circuit and naming Sai V. Vishwanthaiah, Alexander D. Taylor and Jonathan E. Starr as inventors, the application being incorporated herein by reference in its entirety.

This application relates to co-pending U.S. patent application Ser. No. 08/881,940, attorney docket number SP-2486 U.S., filed on Jun. 25, 1997, entitled Method for Controlling the Impedance of a Driver Circuit and naming Sai V. Vishwanthaiah, Alexander D. Taylor and Jonathan E. Starr as inventors, the application being incorporated herein by reference in its entirety.

This application relates to co-pending U.S. patent application Ser. No. 08/881,938, attorney docket number SP-2547 U.S., filed on Jun. 25, 1997, entitled Method for Determining Bit Element Values for Driver Impedance Control and naming Sai V. Vishwanthaiah, Alexander D. Taylor and Jonathan E. Starr as inventors, the application being incorporated herein by reference in its entirety.

This application relates to co-pending U.S. patent application Ser. No. 08/881,927, attorney docket number SP-2485 U.S., filed on Jun. 25, 1997, entitled Method of Broadly Distributing Termination for Buses Using Switched Terminators and naming Jonathan E. Starr as inventor, the application being incorporated herein by reference in its entirety.

BACKGROUND OF THE INVENTION

1. Field of the Invention

The present invention relates to receivers and more particularly to differential receivers for use in information processing systems.

2. Description of the Related Art

In computer and information processing systems, various integrated circuit chips must communicate digitally with each other over common buses. The receiving bus nodes recognize the signal as being high or low using receivers, which are also referred to as input buffers. Often the receiver is a differential receiver, i.e. a receiver that detects the difference between two input signals, referred to as the differential inputs. These input signals may be a received signal and a reference voltage or they may be a received signal and the inverse of the received signal. In either case, it is the difference between the two input signals that the receiver detects in order to determine the state of the received signal.

Integrated circuits are powered at certain voltage levels, which levels are then provided to the various components, such as the receivers, which are located on the integrated circuit. However, the nominal supply voltage for integrated circuits keeps being decreased to reduce power consumption. Additionally, fluctuations of the voltage level during operation can make the voltage level powering a receiver even lower. The lower the supply voltage, the more challenging it is to get a receiver to operate reliably.

The signal frequency at which communication occurs can limit the performance of the overall system. Thus the higher the communication frequency, the better. The maximum frequency at which a system communicates is a function not only of the time that it takes for the electromagnetic wavefronts to propagate on the bus from one chip to another, but also of the time required for the signals to be reliably recognized at the receiving bus nodes as being high or low. Characteristics which affect the time in which a signal is recognized by a receiver include the set up time of the receiver, i.e., the amount of time before a clock edge that a signal must arrive and settle to a recognized level, and the hold time of the receiver, i.e., the time that the received signal must stay at a certain level in order for that level to be detected by the receiver. Other characteristics that affect the ability of the receiver to determine that state of the received signal include the ability of the receiver to reject input noise and power supply noise and the ability of the receiver to resolve small voltage differences between the differential inputs of the receiver.

It is desirable to provide a receiver which can receive signals provided by drivers of different types. Examples of types of drivers include High Speed Transmission Logic (HSTL) drivers, Dynamic Termination Logic (DTL) drivers, and Pseudo Emitter Coupled Logic (PECL) drivers.

SUMMARY OF THE INVENTION

It has been discovered that a receiver may be provided which quickly and efficiently recognizes signals by providing the receiver with a resolving circuit which is coupled to a resistor circuit which converts the signals to voltages that are resolved by the resolving circuit.

Such a receiver advantageously operates with low power supply voltage levels, allows a small sampling window, i.e., a small sum of setup time requirement and hold time requirement, and quickly resolves a differential. Other advantages of the invention include reduced power consumption, high speed operation, good rejection of input noise and power supply noise, ability to resolve small (e.g., 1.0 mVolt) voltage differences, and the ability to function with a variety of types of drivers, including HSTL, DTL and PECL or any other driver type which uses a differential signal.

More specifically, in a preferred embodiment, the invention relates to a differential receiver which includes a first pair of transistors, a second pair of transistors and a resolving circuit. The source of one of the first pair of transistors is coupled to the drain of another of the first pair of transistors. The drain of the one of the first pair of transistors is coupled to a first node. The gate of the one of the first pair of transistors is coupled to a node enable signal and the gate of the another of the first pair of transistors is coupled to a reference voltage. The first pair of transistors provides a voltage at the first node indicative of the reference voltage when the node enable signal is active. The source of one of the second pair of transistors is coupled to the drain of another of the second pair of transistors and the drain of the one of the second pair of transistors is coupled to a second node. The gate of the one of the second pair of transistors is coupled to the node enable signal and the gate of the another of the second pair of transistors is coupled to an input signal. The second pair of transistors provides a voltage at the second node indicative of the voltage of the input signal when the node enable signal is active. The resolving circuit is coupled to the first and second nodes. The resolving circuit is powered by a clock signal and resolves which of the first and second nodes has a higher voltage when the clock signal is active and the node enable signal is active.

In another preferred embodiment the invention relates to a differential receiver which includes a first variable resistor, a second variable resistor and a resolving circuit. The first variable resistor is coupled between a first node and a fixed voltage. The first resistance value of the first variable resistor is controlled by a reference voltage. The first variable resistor provides a voltage at the first node indicative of the reference voltage. The second variable resistor is coupled between a second node and the fixed voltage. The second resistance value of second variable resistor is controlled by an input signal. The second variable resistor provides a voltage at the second node indicative of the input signal. The resolving circuit is coupled to the first and second nodes. The resolving circuit is powered by a clock signal. The resolving circuit resolves which of the first and second nodes has a higher voltage when the clock signal is active.

In another preferred embodiment, the invention relates to a differential receiver which includes a first variable resistor, a second variable resistor, a resolving circuit, a latching circuit, an equalization circuit and an enable circuit. The first variable resistor is coupled between a first node and a fixed voltage. The first resistance value of the first variable resistor is controlled by a reference voltage. The first variable resistor provides a voltage at the first node indicative of the reference voltage. The second variable resistor is coupled between a second node and the fixed voltage. The second resistance value of second variable resistor is controlled by an input signal. The second variable resistor provides a voltage at the second node indicative of the input signal. The resolving circuit is coupled to the first and second nodes. The resolving circuit is powered by a clock signal. The resolving circuit resolves which of the first and second nodes has a higher voltage when the clock signal is active. The latching circuit is coupled to the resolving circuit via the first and second nodes. The latching circuit provides an output signal indicating which of the first and second nodes has a higher voltage. The latching circuit holds the state of the output signal indicating which of the first and second nodes has a higher voltage when the clock signal becomes inactive. The equalization circuit is coupled between the first and second nodes and equalizes the first and second nodes when the clock signal is inactive. The enable circuit receives the clock signal and an input enable signal and provides the node enable signal. The clock signal has an edge and the node enable signal has an edge. The falling edge of the node enable signal is delayed relative to the rising edge of the clock signal to control the sampling window which has an attendant hold time.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
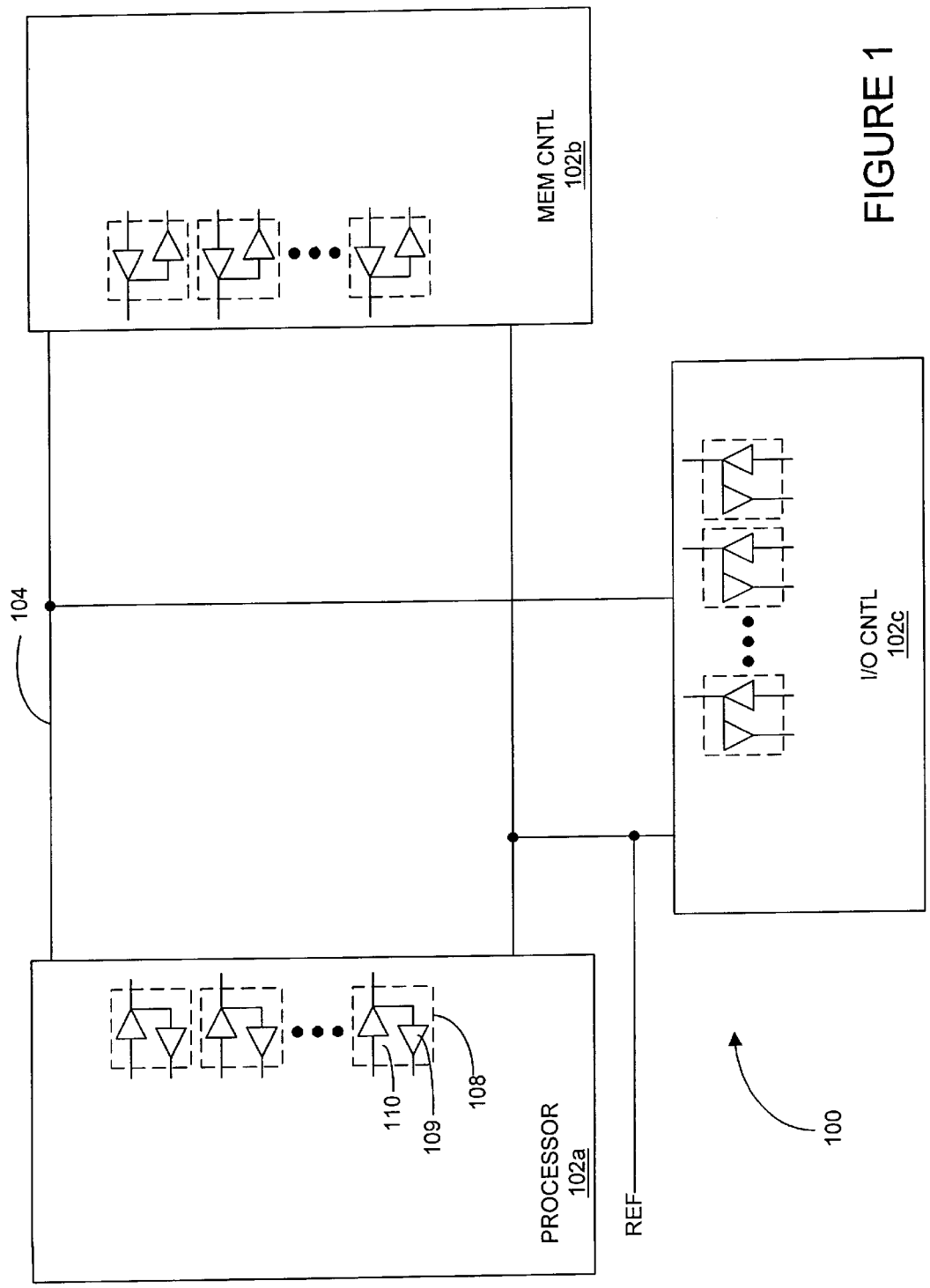
FIG. 1 shows a block diagram of an information handling system having a bus as well as driver circuits in accordance with the present invention.

Referring to FIG. 1, information handling system 100 includes a plurality of components 102 such as processor 102a, memory controller 102b, and I/O controller 102c. It will be appreciated that these components 102 may be any type of component commonly found in an information handling system. Each of these components 102 is generally configured as an individual integrated circuit chip. However, it is known to combine various components into a single integrated circuit chip. Components 102 are coupled via bus 104. Bus 104 includes a plurality of parallel lines which are coupled to individual signal outputs of each of the components 102. It will be appreciated that receiver only and driver only circuits may also be included within component 102. Components 102 are also coupled to a common reference voltage (REF).

Each component 102 includes a plurality of input/output circuits 108 which are coupled to individual signal paths of bus 104. Each input/output circuit 108 includes a receiver circuit 109 and a driver circuit 110. Each receiver circuit 109 is also coupled to the common reference voltage.

In operation, receiver circuits 109 resolve differences in a differential input voltage while operating with a supply voltage as low as slightly more than a transistor threshold voltage, e.g., a voltage that is high enough to turn a transistor on. More specifically, each receiver circuit 109 includes a resolving circuit which is powered by a clock input and which resolves the inputs of a differential input and provides this resolution to a latching circuit which latches the result and provides the result as a receiver output. Prior to latching the result, the receiver inputs are decoupled to facilitate resolving the inputs.

Figure 2:
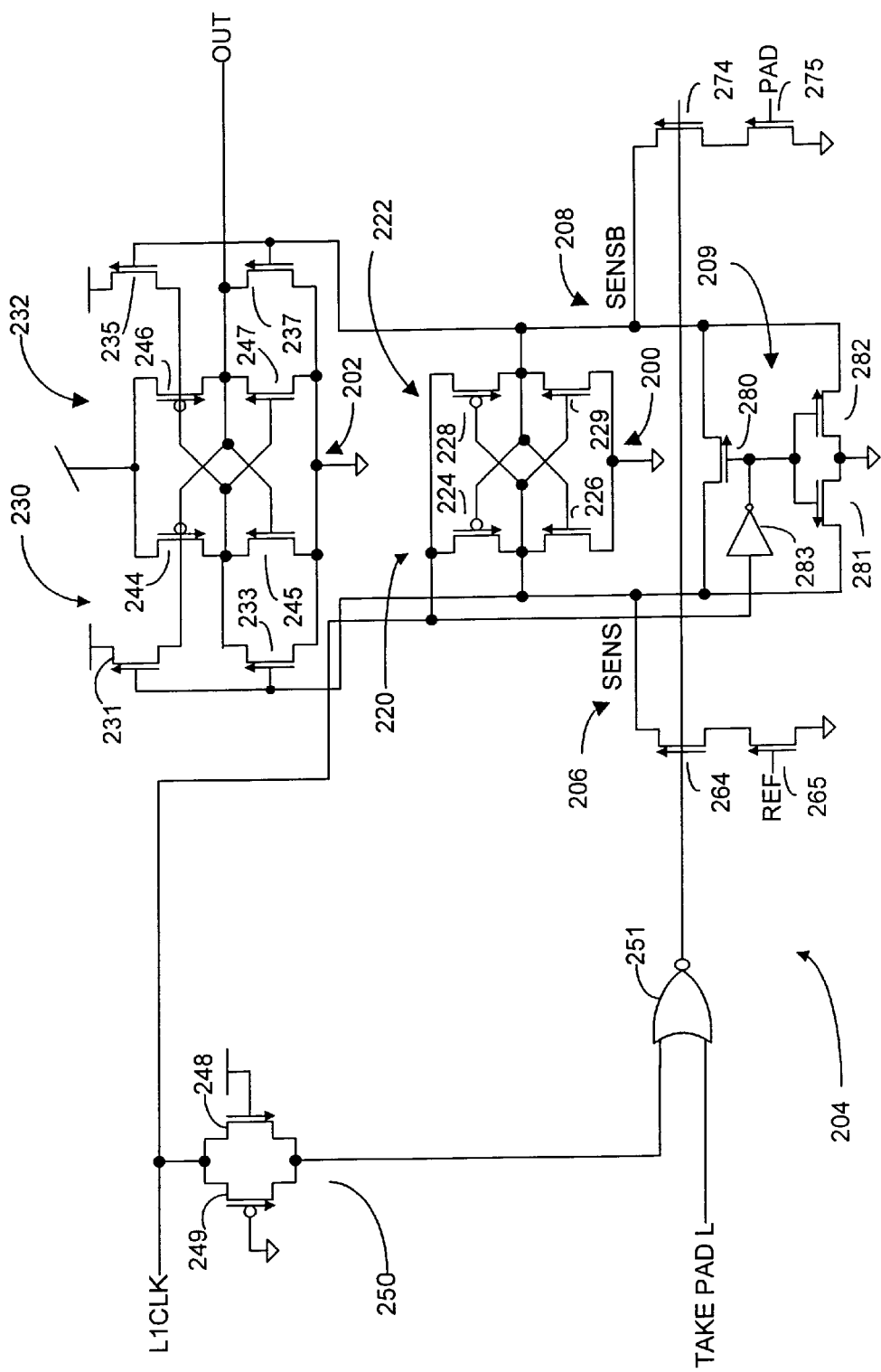
FIG. 2 shows a schematic diagram of a differential receiver of the information handling system of FIG. 1.

Referring to FIG. 2, receiver 109 includes resolving circuit 200 which is coupled to latching circuit 202. Resolving circuit 200 is coupled between first and second sensing nodes, the SENS node and the SENSB node, respectively. Receiver 109 also includes enable circuit 204 which is coupled to first node control circuit 206 and second node control circuit 208. First node control circuit 206 is also coupled to the SENS node and second node control circuit 208 is also coupled to the SENSB node. Receiver 109 also includes node equalization circuit 209 which is coupled to receive a clock input signal and is coupled between the SENS node and the SENSB node.

Resolving circuit 200 includes a pair of cross coupled inverters 220, 222, i.e., an inverter where the output of one inverter is coupled to the gate of the other inverter. Inverter 220 includes a P-channel transistor 224 and an N-channel transistor 226. Inverter 222 includes a P-channel transistor 228 and an N-channel transistor 229. The output of inverter 220 is coupled to the node SENS and the input of inverter 220 is coupled to the node SENSB. The output of inverter 222 is coupled to the node SENSB and the input of inverter 222 is coupled to the node SENS. Accordingly, the output of inverter 220 is coupled to the input of inverter 222 and the output of inverter 222 is coupled to the input of inverter 220.

Inverters 220, 222 of resolving circuit 200, and specifically the sources of transistors 224, 228, are coupled to and powered by the clock signal L1CLK.

Latching circuit 202 includes a pair of cross coupled inverters 230, 232 as well as output-stage transistors 231, 233, 235 and 237. Inverter 230 includes a P-channel transistor 244 and an N-channel transistor 245. Inverter 232 includes a P-channel transistor 246 and an N channel transistor 247. The output of inverter 230 is coupled to the input of inverter 232 and the output of inverter 232 is coupled to the input of inverter 230. Output-stage transistor 231 and output-stage transistor 237 are coupled to the input of inverter 230 and the output of inverter 232. Output-stage transistor 233 and output-stage transistor 235 are coupled to the input of inverter 232 and the output of inverter 230.

Signal decode circuit 204 includes transmission gate 250 which includes P-channel transistor 249 and N-channel transistor 248. Signal decode circuit 204 also includes NOR gate 251. NOR gate 251 receives the clock signal L1CLK, which is transmitted through the transmission gate. NOR gate 251 also receives the TAKE PAD L signal which indicates when to compare the received signal PAD to the reference signal REF. Transmission gate 250 and NOR gate 251 thus determine when the clock signal L1CLK is provided to first node control circuit 206 and second node control circuit 208.

First node control circuit 206 includes a pair of serially coupled N-channel transistors. More specifically, node control circuit 206 includes transistor 264 and transistor 265. Transistor 264 provides an isolation function, i.e., transistor 264 isolates the input signal from the SENS node when inactivated. Transistor 265 provides a variable resistance across which a voltage drops based upon the voltage provided at the gate of transistor 265. Accordingly, transistor 265 provides a pull down function, i.e., transistor 265 pulls down on the node SENS with a strength based upon the voltage provided to its gate input.

Second node control circuit 208 includes a pair of serially coupled N-channel transistors. More specifically, node control circuit 208 includes transistor 274 and transistor 275. Transistor 274 provides an isolation function, i.e., transistor 274 isolates the input signal from the SENSB node when inactivated. Transistor 275 provides a variable resistance across which a voltage drops based upon the voltage provided at the gate input of transistor 275. Accordingly, transistor 275 provides a pull down function, i.e., transistor 275 pulls down on the node SENSB with a strength based upon the voltage provided to its gate input.

Equalization circuit 209 includes transistor 280, transistor 281 and transistor 282. Equalization circuit 209 also includes inverter 283. Equalization circuit 209 provides a node equalization function. When activated, i.e., when the clock signal is low, equalization circuit 209 couples the SENS node to the SENSB node and couples both of these nodes to ground.

In operation, when the clock signal L1CLK is low, resolving circuit 200 is off (i.e., unpowered) and equalization circuit 209 is on. Accordingly, the nodes SENS and SENSB are both coupled to ground. Because the nodes SENS and SENSB are coupled to ground, output-stage transistors 231, 233, 235 and 237 of latch circuit 202 are off. However, transistors 244 and 246 are coupled to VDD and thus latch circuit 202 is on despite the clock signal being low. Accordingly, latching circuit 202 holds its previous value and the OUT signal is maintained as the previous value held in latching circuit 202.

For example, assuming that the previous value of the OUT signal is high. The input to inverter 230, and specifically, the input to the gates of transistor 244 and transistor 245 is high. Thus, transistor 244 is off and transistor 245 is on. Because transistor 244 is off and transistor 245 is on, the output of inverter 230 low. Accordingly, the input to inverter 232, and specifically, the input to the gates of transistor 246 and transistor 247, is low. Thus, transistor 246 is on and transistor 247 is off, causing transistor 246 to pull up the output of inverter 232. The output of inverter 232 is coupled to the output terminal and thus the output of inverter 232 is the OUT signal. In this manner, latch circuit 202 holds the OUT value. Because the gates of output-stage transistors 231, 233, 235 and 237 are coupled to ground, these transistors are off. Therefore transistors 231, 233, 235 and 237 do not affect the value of OUT at this time (i.e., when the L1CLK signal is low). However, because inverters 230 and 232 are powered by VDD and not by the clock signal, when the clock signal is low, the clock signal does not affect the operation of latching circuit 202.

Alternately, assuming that the previous value of the OUT signal is low. The input to inverter 230, and specifically the input to the gates of transistor 244 and 245 is low. Thus, transistor 244 is on and transistor 245 is off. Because transistor 244 is on and transistor 245 is off, the output of inverter 230 is high. Accordingly, the input to inverter 232, and specifically, the input to the gates of transistor 246 and transistor 247, is high. Thus, transistor 246 is off and transistor 247 is on, causing transistor 247 to pull down the output of inverter 232. As above, because the output of inverter 232 is coupled to the output terminal and thus the output of inverter 232 provides the OUT signal, the latch circuit 202 holds the OUT value. Because the gates of output-stage transistors 231, 233, 235 and 237 are coupled to ground, these transistors are off and thus do not affect the value of OUT at this time. However, because inverters 230 and 232 are powered by VDD and not by the clock signal, when the clock signal is low, the clock signal does not affect the operation of latching circuit 202.

However, when either node SENS or node SENSB are not pulled to ground, then the output-stage transistors affect the operation of latching circuit 202. More specifically, assuming that the node SENS is high and the node SENSB is low, then transistor 235 and transistor 237 are off and transistor 231 and transistor 233 are on. Because transistor 231 is on, the input to inverter 230, and specifically, the input to the gates of transistor 244 and transistor 245, is pulled high. Therefore transistor 244 is off and transistor 245 is on. This pulls the output of inverter 230, and therefore the input to inverter 232, low. Additionally, because transistor 233 is on, this contributes to pulling the output of inverter 230 low and the input to inverter 232 low. Accordingly transistor 246 is on and transistor 247 is off. Turning on transistor 246 pulls up the OUT signal and enhances the turning on of transistor 245 and the turning off of transistor 244. Turning on transistor 245 pulls down the gate input of transistors 246 and 247 which reinforces the turning on of transistor 246 and the turning off of transistor 247. The net effect of SENS being high and SENSB being low is transistors 231 and 233 are on, transistors 235 and 237 are off, transistor 246 is on and transistor 247 is off and transistor 244 is off and transistor 245 is on. Accordingly, latching circuit 202 is a self-reinforcing circuit in which the output signal OUT is high.

If the node SENS is low and the node SENSB is high then the operation of latching circuit 202 is effectively the opposite. Specifically, the net effect is that transistors 231 and 233 are off, transistor 235 and 237 are on, transistor 246 is off and transistor 247 is on and transistor 244 is on and transistor 245 is off. Accordingly, latching circuit 202 is a self-reinforcing circuit in which the output signal OUT is low.

When the clock signal L1CLK is low, resolving circuit 200 is off and the node SENS and the node SENSB are coupled to ground. Because the clock signal is the source for transistors 224 and 228, the transistors cannot turn on because the gate to source voltage of transistor 224 and transistor 228 is zero.

Additionally, when the input to NOR gate 251 that is driven by the clock signal L1CLK is low, and the TAKE PAD L signal is active, i.e., low, the output of enable circuit 204 is high. When the output of enable circuit 204 is high, transistor 264 of node control circuit 206 and transistor 274 of node control circuit 208 are on and thus the input signals REF and PAD are not isolated from the nodes SENS and SENSB. However, nodes SENS and SENSB are coupled to ground via equalization circuit 209 and via the L1CLK clock signal, which is low.

Because the gate of transistor 265 is coupled to the REF signal and the gate of transistor 275 is coupled to the PAD signal which are then ultimately coupled to the nodes SENS and SENSB, a differential signal may be detected. The REF signal has a voltage to compare with the PAD signal in a differential manner. For example, the REF signal may be the inverse of the PAD signal. Alternately, the REF signal voltage may chosen to be approximately halfway between the rails of signal swing of the received signal. For example, in an HSTL class I system, the signal swing is symmetric about VDD/2. Accordingly, the voltage of the REF signal would be VDD/2. Also for example, in a DTL system, the signal swing may be approximately from VDD to VDD/2. Accordingly, the voltage of the REF signal would be 3/4 (VDD).

When the clock signal L1CLK transitions from low to high, equalization circuit 209, and specifically, transistors 280, 281 and 282 turn off, thereby isolating the node SENS from the node SENSB and isolating both nodes from ground.

Additionally, when the clock signal L1CLK starts to go high, early in the rise time the clock signal voltage goes above the threshold voltage of the PMOS transistors 224 and 228, and thus transistors 224 and 228 turn on since their gate voltages are initially at ground. At this point, transistors 226 and 229 are still off. Accordingly, receiver 109 can start detecting the received signal when the clock voltage is slightly more than a single transistor threshold voltage. When transistor 224 turns on, it starts pulling up on node SENS. When transistor 228 turns on, it starts pulling up on node SENSB. Transistor 224 is pulling up on node SENS while transistor 265 is pulling down on the node via transistor 264. Additionally, transistor 228 is pulling up on node SENSB while transistor 275 is pulling down on the node via transistor 274. Accordingly, a drive fight between these transistors occurs.

Because transistors 224 and 228 have about the same drive strength, the drive strength of transistors 265 and 275 determines which node has the higher voltage. More specifically, when the PAD signal has a greater voltage level than the REF signal, then transistor 275 is more strongly turned on than transistor 265. Accordingly transistor 275 has a lower drain to source resistance than transistor 265. Accordingly, the voltage level at the node SENSB is lower than the voltage level at the node SENS. (Alternately, when the PAD signal has a lower voltage than the REF signal, then transistor 265 is more strongly turned on than transistor 275. Accordingly, the voltage level at the node SENS is lower than the voltage level at the node SENSB.)

Because transistor 275 is turned on more strongly, it holds down the voltage of the node SENSB more than transistor 265 holds down the voltage of the node SENS. I.e., because transistor 224 has a weaker drive strength against which it's pulling than does transistor 228, the SENS node pulls up faster than the SENSB node. The process is self-reinforcing since the PMOS transistor with the lower gate voltage is turned on more strongly.

Eventually, in this example, the SENS node crosses the threshold voltage of transistor 229. Transistor 229 then reinforces the voltage differential of the SENS and SENSB nodes. The voltage at node SENSB may not rise high enough to turn on transistor 226. However even if transistor 226 does turn on, since the gate of transistor 229 is at a higher voltage than that of the gate of transistor 226, transistor 229 pulls down more strongly on the SENSB node then transistor 226 pulls down on the SENS node.

At this point because transistors 265 and 275 are trying to pull down the nodes SENS and SENSB respectively, these transistors interfere with the cross-coupling effect of the transistors within resolving circuit 200. Accordingly, enable circuit 204 is designed to shut off transistors 264 and 274 at this time, thereby effectively isolating transistors 265 and 275 from the nodes SENS and SENSB, respectively. This allows resolving circuit 200 to drive its outputs to the rails more quickly. When transistors 265 and 275 are isolated, transistor 229 provides a stronger pull down effect so that the node with the lower voltage is eventually pulled to ground while the node with the higher voltage is eventually pulled up to VDD by transistor 224. One node is pulled to ground to shut off one set of output-stage transistors of latching circuit 202. The other node is pulled up to VDD to turn on the other set of output-stage transistors.

Figure 3:
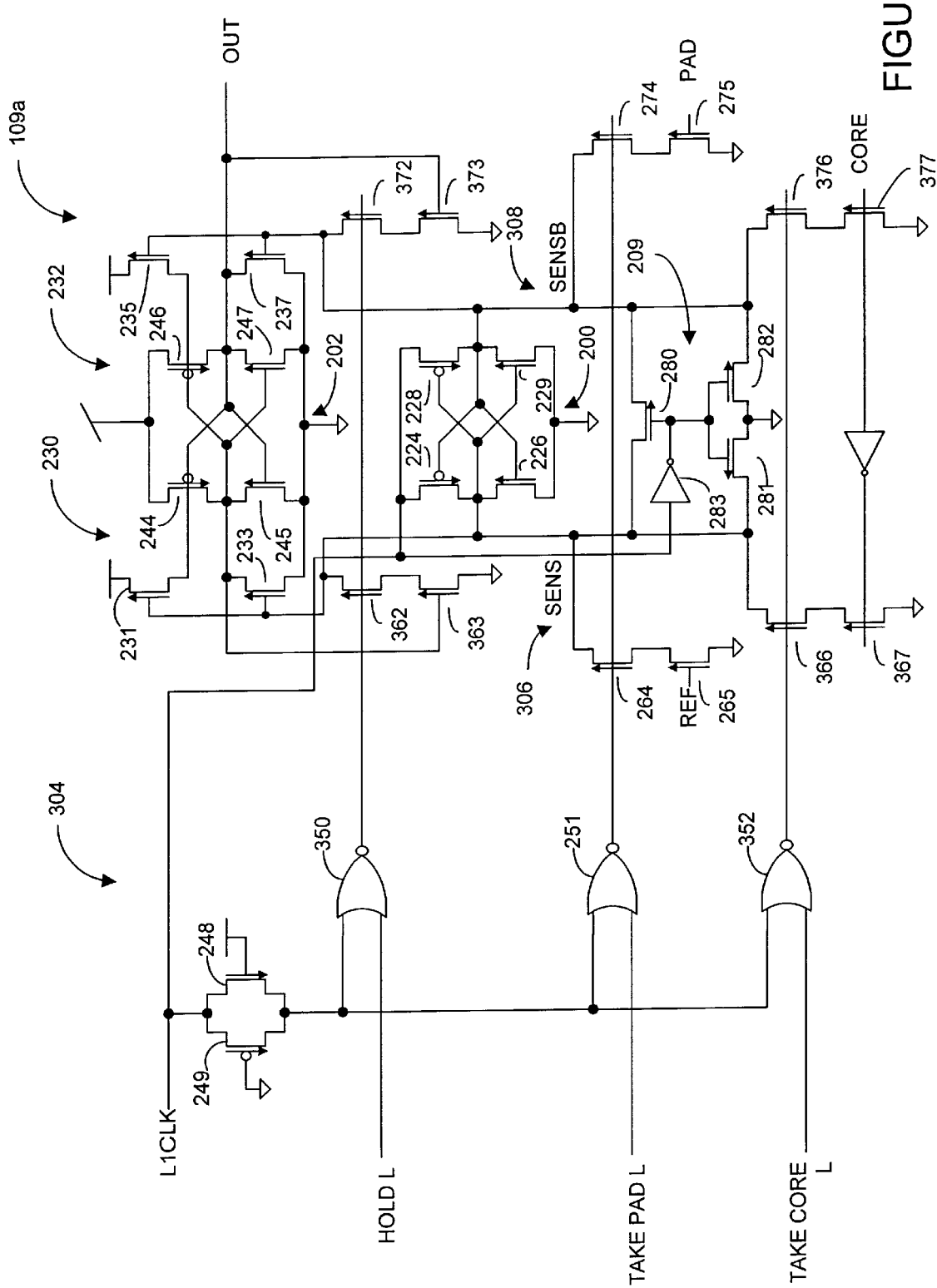
FIG. 3 shows a schematic diagram of a differential receiver having three inputs.

Referring to FIG. 3, receiver circuit 109a may be configured to detect one of three different differential signals. This receiver circuit includes a resolving circuit 200, a latching circuit 202 and an equalization circuit 209 as receiver 109. However, receiver 109a includes additional decode logic within enable circuit 304 to control which nodes are detected by receiver 109a. Receiver 109a also includes additional node control circuitry to select which nodes are detected by receiver 109a.

More specifically, in addition to the circuitry within enable circuit 204, enable circuit 304 includes NOR gate 350 and NOR gate 352. NOR gate 350 receives a hold signal (HOLD L) in addition to the delayed clock signal. NOR gate 352 receives a take core voltage (TAKE CORE L) signal in addition to the delayed clock signal. The HOLD L signal, TAKE CORE L signal and TAKE PAD L signal are controlled so that only one of these signals is active (i.e., low) at any given time. Accordingly, only one of the output signals of enable circuit 304 is active (i.e., high) at any given time.

In addition to the circuitry within first node control circuit 206, first selection circuit 306 includes a plurality of additional transistor pairs functioning as individual node control circuits; each pair of additional transistors corresponds to the additional logic gates of enable circuit 304. Specifically, first node selection circuit 306 includes transistor 362, transistor 363, transistor 366 and transistor 367. In addition to the circuitry within second node control circuit 208, second node selection circuit 308 includes a plurality of additional transistor pairs that correspond to the additional logic gates of enable circuit 304. Specifically, second node selection circuit 308 includes transistor 372, transistor 373, transistor 376 and transistor 377.

The gates of transistor 362 and transistor 372 are coupled to the output of NOR gate 350 and are thus on when the HOLD L signal is active. The gate of transistor 363 is coupled to the output of inverter 230. The gate of transistor 373 is coupled to the output of inverter 232. Accordingly, when the HOLD L signal is active, the output signal OUT and the inverse of the output signal OUT act as inputs which determine which of transistor 363 and transistor 373 is on and which is off, thereby controlling which of node SENS and node SENSB has the higher voltage. Accordingly, when these nodes are selected, receiver 109a maintains its present output value as its output value during the next clock cycle beginning with a rising clock edge.

The gates of transistor 366 and 376 are coupled to the output of NOR gate 352 and are thus on when the TAKE CORE L signal is active (i.e., low). The gate of transistor 377 is coupled to the input signal CORE and the gate of transistor 367 is coupled to the inverse of the input signal CORE. Accordingly, when the TAKE CORE L signal is active, the state of the signal CORE and its inverse act as inputs to determine which of transistor 367 and transistor 377 is on and which is off, thereby controlling which of node SENS and SENSB has the higher voltage. This circuit allows a known value, such as a test value or a reset value, to be provided as an input to receiver 109.

Referring to FIGS. 2 and 3, the setup time requirement for a receiver is the amount of time before the rising clock edge attains 50% of its swing that the differential inputs to the receiver must settle to levels that can be accurately recognized and captured by the receiver. The setup time of receiver 109 is zero or less because there is no need to establish a predefined initial signal within resolving circuit 200 (i.e., a zero signal level between the SENS node and the SENSB node is the starting point of resolution) and there is zero delay between establishing an input differential signal level between the PAD input and the REF input and developing a difference in the resistance between the grounded variable resistors which are coupled to the SENS and SENSB nodes.

Consequently, since the L1CLK signal supplies resolving circuit 200 with power, the rising edge of the L1CLK signal coincides with the activation of resolving circuit 200, which then resolves a resistance imbalance at the SENS and SENSB nodes, having started with a zero imbalance. Note that the zero initial imbalance persists before the L1CLK signal rises, regardless of the voltage levels at the PAD and REF input nodes. This is true because a resistance difference in the absence of current still yields the same voltage difference, i.e., zero. Thus, there is no setup delay as distinguished from prior systems that require the establishment of initial imbalances (and the counteracting of previous imbalances left over by a just switched input) which would require time to establish before the activation of a resolving circuit.

The hold time requirement for the receiver is the amount of time after the rising clock edge attains 50% of its swing that a data signal must be maintained at a level that can be accurately recognized and amplified by the receiver 109. The voltage difference between the inputs of the receiver 109 is amplified by the cross coupled resolving circuit 200, the outputs and inputs of which are the voltages on nodes SENS and SENSB. Because the resolving circuit 200 is cross coupled, and depending on the relative sizing of the transistors in receiver circuit 109, there is a point in the swing of the nodes SENS and SENSB after which the output of resolving circuit 200 continues swinging to the rails, and the logic sense that has been established on the nodes SENS and SENSB will be captured by the latching circuit 202, even if the inputs to receiver 109 change. The difference between this point in time and the time that the rising clock edge attains 50% of its swing constitutes the hold time requirement of receiver 109.

In some other sense amplifier designs, the transistors whose gates are driven by the inputs (i.e., those transistors that act as voltage controlled resistors) are in series with the transistors of the cross coupled resolving circuit. In the sense amplifier of receiver 109, the transistors which function as variable resistors, e.g., transistors 265, 275, are coupled in parallel with the NMOS transistors of the cross coupled resolving circuit 200. This configuration reduces the net resistance and increases the net current flow through the current path which includes resolving circuit 200, thus allowing resolving circuit 200 to amplify the inputs more quickly, which thereby reduces the hold time requirement and reduces the clock-to-out propagation delay time of receiver 109.

The sum of the set up time and hold time requirements of a receiver 109 constitutes the sampling window of a receiver. The smaller the sampling window, the higher the rate at which the receiver can accurately resolve input signals and the higher the data rate at which a signaling system employing this receiver can operate. Therefore, the relatively short set up time and hold time requirements that are attainable with receiver 109 constitute significant performance advantages for receiver 109.

Other Embodiments

Other embodiments are within the following claims.

For example, while two examples have been set forth regarding the number of input signals that may be detected, it will be appreciated that any number of input signals may be individually detected by adjusting the number of logic gates within the enable circuit and the number of node control inputs within the first and second node control circuits.

Also for example, it will be appreciated that other circuit configurations may be used to provide the latching function of latching circuit 202. Also for example, it will be appreciated that other circuit configurations may be used to provide the equalizing function of equalization circuit 209.

In the present invention, a MOS transistor may be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N-channel MOS device equations merely refers to whichever diffusion (drain or source) has the lower voltage at any given time. For example, the "source" of an N-channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

Also, for example, while certain portions of the preferred embodiment are shown as active low circuits and other portions as active high circuits, it will appreciated that the choice of whether a circuit or portion thereof is active low or active high is merely one of design.

What is claimed is:

1. A differential receiver comprising a first pair of transistors, each of the first pair of transistors including a drain, a source and a gate, the source of one of the first pair of transistors being coupled to the drain of another of the first pair of transistors, the drain of the one of the first pair of transistors being coupled to a first node, the gate of the one of the first pair of transistors being coupled to a node enable signal, and the gate of the another of the first pair of transistors being coupled to a reference voltage, the first pair of transistors providing a voltage at the first node indicative of the reference voltage when the node enable signal is active;

a second pair of transistors, each of the second pair of transistors including a drain, a source and a gate, the source of one of the second pair of transistors being coupled to the drain of another of the second pair of transistors, the drain of the one of the second pair of transistors being coupled to a second node, the gate of the one of the second pair of transistors being coupled to the node enable signal, and the gate of the another of the second pair of transistors being coupled to an input signal, the second pair of transistors providing a voltage at the second node indicative of the voltage of the input signal when the node enable signal is active;

a resolving circuit coupled to the first and second nodes, the resolving circuit being powered by a clock signal, the resolving circuit resolving which of the first and second nodes has a higher voltage when the clock signal is active and the node enable signal is active; and, an enable circuit, the enable circuit receiving the clock signal and an input enable signal, the clock signal having an edge and providing the node enable signal having an edge, the edge of the node enable signal being delayed relative to the edge of the clock signal.

2. The differential receiver of claim 1, wherein the resolving circuit includes a first inverter; and a second inverter, the first and second inverters being cross coupled.

3. The differential receiver of claim 2 wherein the first inverter includes first and second transistors, the first and second transistors of the first inverter each including a gate, a source and a drain;

the second inverter includes first and second transistors, the first and second transistors of the second inverter each including a gate, a source and a drain;

the drains of the first and second transistors of the first inverter are coupled to the gates of the first and second transistors of the second inverter and to the first node; and the drains of the first and second transistors of the second inverter are coupled to the gates of the first and second transistors of the first inverter and to the second node.

4. The differential receiver of claim 3 wherein the source of one of the first and second transistors of the first inverter is coupled to the clock signal; and the source of one of the first and second transistors of the second inverter is coupled to the clock signal.

5. The differential receiver of claim 4 wherein the one of the first and second transistors of the first inverter is an NMOS transistor; and the one of the first and second transistors of the second inverter is an NMOS transistor.

6. The differential receiver of claim 4 wherein the source of another of the first and second transistors of the first inverter is coupled to a fixed voltage; and the source of another of the first and second transistors of the second inverter is coupled to a fixed voltage.

7. The differential receiver of claim 6 wherein the fixed voltage is ground.

8. The differential receiver of claim 6 wherein the another of the first and second transistors of the first inverter is a P-channel transistor; and the another of the first and second transistors of the second inverter is a P-channel transistor.

9. The differential receiver of claim 1 further comprising a latching circuit coupled to the resolving circuit via the first and second nodes, the latching circuit providing an output signal indicating which of the first and second nodes has a higher voltage, the latching circuit holding the state of the output signal indicating which of the first and second nodes has a higher voltage when the clock signal becomes inactive.

10. The differential receiver of claim 9, wherein the latching circuit includes a first inverter; and a second inverter, the first and second inverters being cross coupled.

11. The differential receiver of claim 10 wherein the first inverter includes first and second transistors, the first and second transistors of the first inverter each including a gate, a source and a drain;

the second inverter includes first and second transistors, the first and second transistors of the second inverter each including a gate, a source and a drain;

the drains of the first and second transistors of the first inverter are coupled to the gates of the first and second transistors of the second inverter and to the first node; and the drains of the first and second transistors of the second inverter are coupled to the gates of the first and second transistors of the first inverter and to the second node.

12. The differential receiver of claim 11 wherein the source of one of the first and second transistors of first inverter is coupled to a voltage source; and the source of one of the first and second transistors of the second inverter is coupled to the voltage source.

13. The differential receiver of claim 12 wherein the source of another of the first and second transistors of first inverter is coupled to ground; and the source of another of the first and second transistors of the second inverter is coupled to ground.

14. The differential receiver of claim 10 wherein the latching circuit includes an output-stage circuit having first and second output-stage portions, the output-stage portions determining the states of the first and second inverters when one of the first and second nodes is active.

15. The differential receiver of claim 1 further comprising:

an equalization circuit coupled between the first and second nodes, the equalization circuit equalizing the first and second nodes when the clock signal is inactive.

16. The differential receiver of claim 1 wherein the enable circuit includes a transmission gate, the transmission gate receiving the clock signal and providing a delayed clock signal, the enable signal being provided based upon the delayed clock signal.

17. The differential receiver of claim 1 wherein the enable circuit includes a logic gate, the logic gate being coupled to receive the clock signal as well as an input enable signal, the logic gate providing the node enable signal when the input enable signal is active.

18. A differential receiver comprising:

a first variable resistor having a first resistance value, the first variable resistor being coupled between a first node and a fixed voltage, the first resistance value of the first variable resistor being controlled by a reference voltage, the first variable resistor providing a voltage at the first node indicative of the reference voltage;

a second variable resistor having a second resistance value, the second variable resistor being coupled between a second node and the fixed voltage, the second resistance value of the second variable resistor being controlled by an input signal, the second variable resistor providing a voltage at the second node indicative of the input signal;

a resolving circuit coupled to the first and second nodes, the resolving circuit being powered by a clock signal, the resolving circuit resolving which of the first and second nodes has a higher voltage when the clock signal is active; and, an enable circuit, the enable circuit receiving the clock signal and an input enable signal, the clock signal having an edge and providing the node enable signal having an edge, the edge of the node enable signal being delayed relative to the edge of the clock signal.

19. The differential receiver of claim 18 wherein the fixed voltage is ground.

20. The differential receiver of claim 18, wherein the resolving circuit includes a first inverter; and a second inverter, the first and second inverters being cross coupled.

21. The differential receiver of claim 20 wherein the first inverter includes first and second transistors, the first and second transistors of the first inverter each including a gate, a source and a drain;

the second inverter includes first and second transistors, the first and second transistors of the second inverter each including a gate, a source and a drain;

the drains of the first and second transistors of the first inverter are coupled to the gates of the first and second transistors of the second inverter and to the first node; and the drains of the first and second transistors of the second inverter are coupled to the gates of the first and second transistors of the first inverter and to the second node.

22. The differential receiver of claim 21 wherein the source of one of the first and second transistors of first inverter is coupled to the clock signal; and the source of one of the first and second transistors of the second inverter is coupled to the clock signal.

23. The differential receiver of claim 22 wherein the one of the first and second transistors of the first inverter is an NMOS transistor; and the one of the first and second transistors of the second inverter is an NMOS transistor.

24. The differential receiver of claim 22 wherein the source of another of the first and second transistors of the first inverter is coupled to a fixed voltage; and the source of another of the first and second transistors of the second inverter is coupled to a fixed voltage.

25. The differential receiver of claim 24 wherein the fixed voltage is ground.

26. The differential receiver of claim 24 wherein the another of the first and second transistors of the first inverter is a P-channel transistor; and the another of the first and second transistors of the second inverter is a P-channel transistor.

27. The differential receiver of claim 18 further comprising:

a latching circuit coupled to the resolving circuit via the first and second nodes, the latching circuit providing an output signal indicating which of the first and second nodes has a higher voltage, the latching circuit holding the state of the output signal indicating which of the first and second nodes has a higher voltage when the clock signal becomes inactive.

28. The differential receiver of claim 27, wherein the latching circuit includes a first inverter; and a second inverter, the first and second inverters being cross coupled.

29. The differential receiver of claim 28 wherein the first inverter includes first and second transistors, the first and second transistors of the first inverter each including a gate, a source and a drain;

the second inverter includes first and second transistors, the first and second transistors of the second inverter each including a gate, a source and a drain;

the drains of the first and second transistors of the first inverter are coupled to the gates of the first and second transistors of the second inverter and to the first node; and the drains of the first and second transistors of the second inverter are coupled to the gates of the first and second transistors of the first inverter and to the second node.

30. The differential receiver of claim 29 wherein the source of one of the first and second transistors of first inverter is coupled to a voltage source; and the source of one of the first and second transistors of the second inverter is coupled to the voltage source.

31. The differential receiver of claim 30 wherein the source of another of the first and second transistors of first inverter is coupled to ground; and the source of another of the first and second transistors of the second inverter is coupled to ground.

32. The differential receiver of claim 28 wherein the latching circuit includes an output-stage circuit having first and second output-stage portions, the first output-stage portion being coupled to the first inverter and to the first node and the second output-stage portion being coupled to the second inverter and to the second node, the output-stage portions determining the states of the first and second inverters when one of the first and second nodes is active.

33. The differential receiver of claim 18 further comprising:

an equalization circuit coupled between the first and second nodes, the equalization circuit equalizing the first and second nodes when the clock signal is inactive.

34. The differential receiver of claim 18 wherein the enable circuit includes a transmission gate, the transmission gate receiving the clock signal and providing a delayed clock signal, the enable signal being provided based upon the delayed clock signal.

35. The differential receiver of claim 18 wherein the enable circuit includes a logic gate, the logic gate being coupled to receive the clock signal as well as an input enable signal, the logic gate providing the node enable signal when the input enable signal is active.

36. A differential receiver comprising:

a first variable resistor having a first resistance value, the first variable resistor being coupled between a first node and a fixed voltage, the first resistance value of the first variable resistor being controlled by a reference voltage, the first variable resistor providing a voltage at the first node indicative of the reference voltage;

a second variable resistor having a second resistance value, the second variable resistor being coupled between a second node and the fixed voltage, the second resistance value of second variable resistor being controlled by an input signal, the second variable resistor providing a voltage at the second node indicative of the input signal; and a resolving circuit coupled to the first and second nodes, the resolving circuit being powered by a clock signal, the resolving circuit resolving which of the first and second nodes has a higher voltage when the clock signal is active;

a latching circuit coupled to the resolving circuit via the first and second nodes, the latching circuit providing an output signal indicating which of the first and second nodes has a higher voltage, the latching circuit holding the state of the output signal indicating which of the first and second nodes has a higher voltage when the clock signal becomes inactive;

an equalization circuit coupled between the first and second nodes, the equalization circuit equalizing the first and second nodes when the clock signal is inactive; and an enable circuit, the enable circuit receiving the clock signal and an input enable signal, the clock signal having an edge and providing a node enable signal having an edge, the edge of the node enable signal being delayed relative to the edge of the clock signal.

37. The differential receiver of claim 36 wherein the fixed voltage is ground.

38. The differential receiver of claim 36, wherein the resolving circuit includes a first inverter; and a second inverter, the first and second inverters being cross coupled.

39. The differential receiver of claim 38 wherein the first inverter includes first and second transistors, the first and second transistors of the first inverter each including a gate, a source and a drain;

the second inverter includes first and second transistors, the first and second transistors of the second inverter each including a gate, a source and a drain;

the drains of the first and second transistors of the first inverter are coupled to the gates of the first and second transistors of the second inverter and to the first node; and the drains of the first and second transistors of the second inverter are coupled to the gates of the first and second transistors of the first inverter and to the second node.

40. The differential receiver of claim 39 wherein the source of one of the first and second transistors of the first inverter is coupled to the clock signal; and the source of one of the first and second transistors of the second inverter is coupled to the clock signal.

41. The differential receiver of claim 40 wherein the one of the first and second transistors of the first inverter is an NMOS transistor; and the one of the first and second transistors of the second inverter is an NMOS transistor.

42. The differential receiver of claim 40 wherein the source of another of the first and second transistors of the first inverter is coupled to the fixed voltage; and the source of another of the first and second transistors of the second inverter is coupled to the fixed voltage.

43. The differential receiver of claim 42 wherein the fixed voltage is ground.

44. The differential receiver of claim 42 wherein the another of the first and second transistors of the first inverter is a P-channel transistor; and the another of the first and second transistors of the second inverter is a P-channel transistor.

45. The differential receiver of claim 36, wherein the latching circuit includes a first inverter; and a second inverter, the first and second inverters being cross coupled.

46. The differential receiver of claim 45 wherein the first inverter includes first and second transistors, the first and second transistors of the first inverter each including a gate, a source and a drain;

the second inverter includes first and second transistors, the first and second transistors of the second inverter each including a gate, a source and a drain;

the drains of the first and second transistors of the first inverter are coupled to the gates of the first and second transistors of the second inverter and to the first node; and the drains of the first and second transistors of the second inverter are coupled to the gates of the first and second transistors of the first inverter and to the second node.

47. The differential receiver of claim 46 wherein the source of one of the first and second transistors of the first inverter is coupled to a voltage source; and the source of one of the first and second transistors of the second inverter is coupled to the voltage source.

48. The differential receiver of claim 47 wherein the source of another of the first and second transistors of the first inverter is coupled to ground; and the source of another of the first and second transistors of the second inverter is coupled to ground.

49. The differential receiver of claim 40 wherein the latching circuit includes an output-stage circuit having first and second output-stage portions, the first output-stage portion being coupled to the first inverter and to the first node and the second output-stage portion being coupled to the second inverter and to the second node, the output-stage portions determining the states of the first and second inverters when one of the first and second nodes is active.

50. The differential receiver of claim 36 wherein the enable circuit includes a transmission gate, the transmission gate receiving the clock signal and providing a delayed clock signal, the enable signal being provided based upon the delayed clock signal.

51. The differential receiver of claim 36 wherein the enable circuit includes a logic gate, the logic gate being coupled to receive the clock signal as well as the input enable signal, the logic gate providing the node enable signal when the input enable signal is active.

* * * * *